United States Patent
Villemazet et al.

(10) Patent No.: US 6,340,917 B1
(45) Date of Patent: Jan. 22, 2002

(54) BROAD FREQUENCY BAND LINEARIZATION DEVICE

(75) Inventors: Jean-François Villemazet, Cintegabelle; Pascal Moroni, Toulouse; Bernard Cogo, Montrabe, all of (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/527,595

(22) Filed: Mar. 17, 2000

(30) Foreign Application Priority Data

Mar. 18, 1999 (FR) .............................................. 99 03396

(51) Int. Cl.$^7$ ............................................... H03F 1/26
(52) U.S. Cl. ......................... 330/149; 330/53; 375/296
(58) Field of Search .................... 330/53, 149; 375/296, 375/297; 455/63

(56) References Cited

U.S. PATENT DOCUMENTS

| | | | |
|---|---|---|---|
| 3,849,676 A | * 11/1974 | Bareyt | 330/43 |
| 5,172,068 A | 12/1992 | Childs | 330/149 |
| 5,523,716 A | * 6/1996 | Grebliunas et al. | 330/149 |
| 5,600,472 A | * 2/1997 | Uesaka | 359/161 |
| 5,789,978 A | * 8/1998 | Zhang et al. | 330/149 |

FOREIGN PATENT DOCUMENTS

WO    WO 99/10987    3/1999

OTHER PUBLICATIONS

Yumauchi K. et al.: "A NLVEL Series Diode Linearizer for Mobile Radio Power Amplifiers" IEEE MTT-S International Microwave Symposium Digest, US, New York, IEEE, p. 831–834, XP000731984, ISBN: 0–7803–3247–4.

Yamauchi K. et al.: "A Microwave Miniaturized Linearizer Using A Parallel Diode with a Bias Feed Resistance" IEEE Transactions on Microwave Theory and Techniques, US, IEEE Inc., New York, vol. 45, No. 12, part 02, p. 2431–2434 XP000732030.

\* cited by examiner

*Primary Examiner*—Tuan T. Lam
(74) *Attorney, Agent, or Firm*—Sughrue Mion, PLLC

(57) ABSTRACT

The invention relates to a device for linearizing the gain and phase of an amplifier operating in the UHF range. The gain and phase of the amplifier are linearized by conferring a predistortion of the gain and phase, which compensates for the non-linearities in gain and phase of the corresponding amplifier, notably of the electronic-tube type. The device has a first channel with a series-connected Schottky diode that receives the input signal, a second channel with a parallel-connected Schottky diode that also receives the input signal, and a coupler for phasing the output signals supplied by the first and second channels.

25 Claims, 2 Drawing Sheets

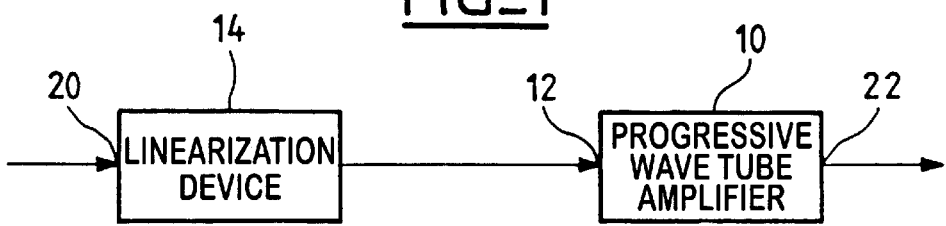
FIG_1
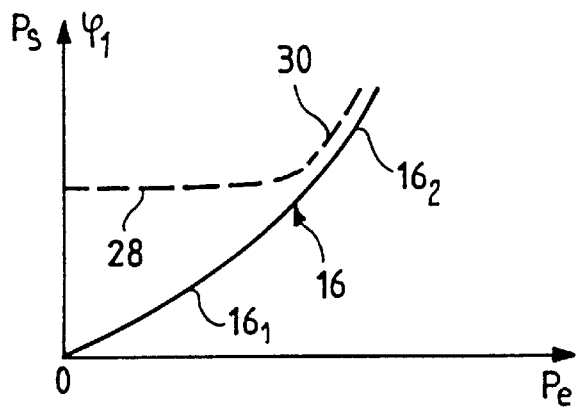
FIG_1a
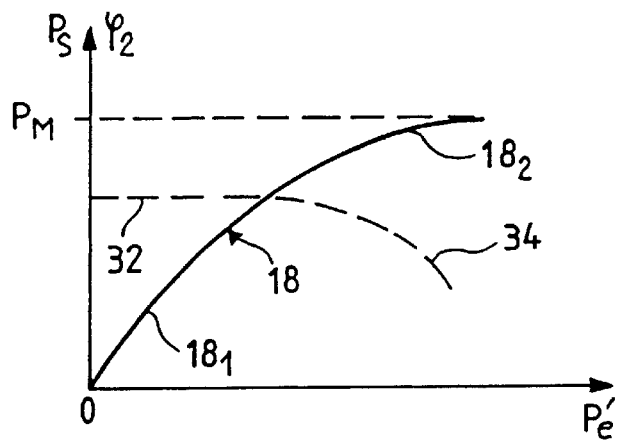
FIG_1b
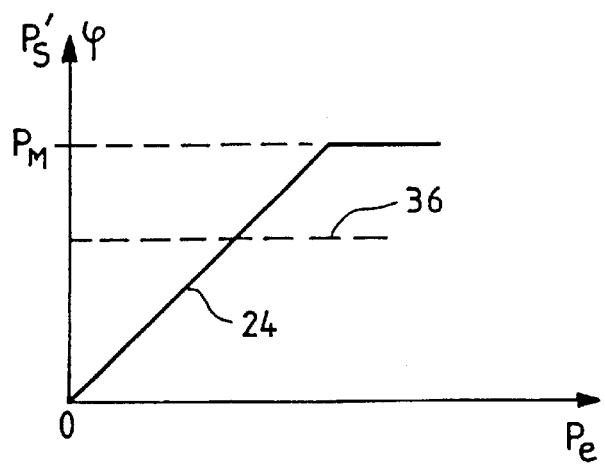
FIG_1c

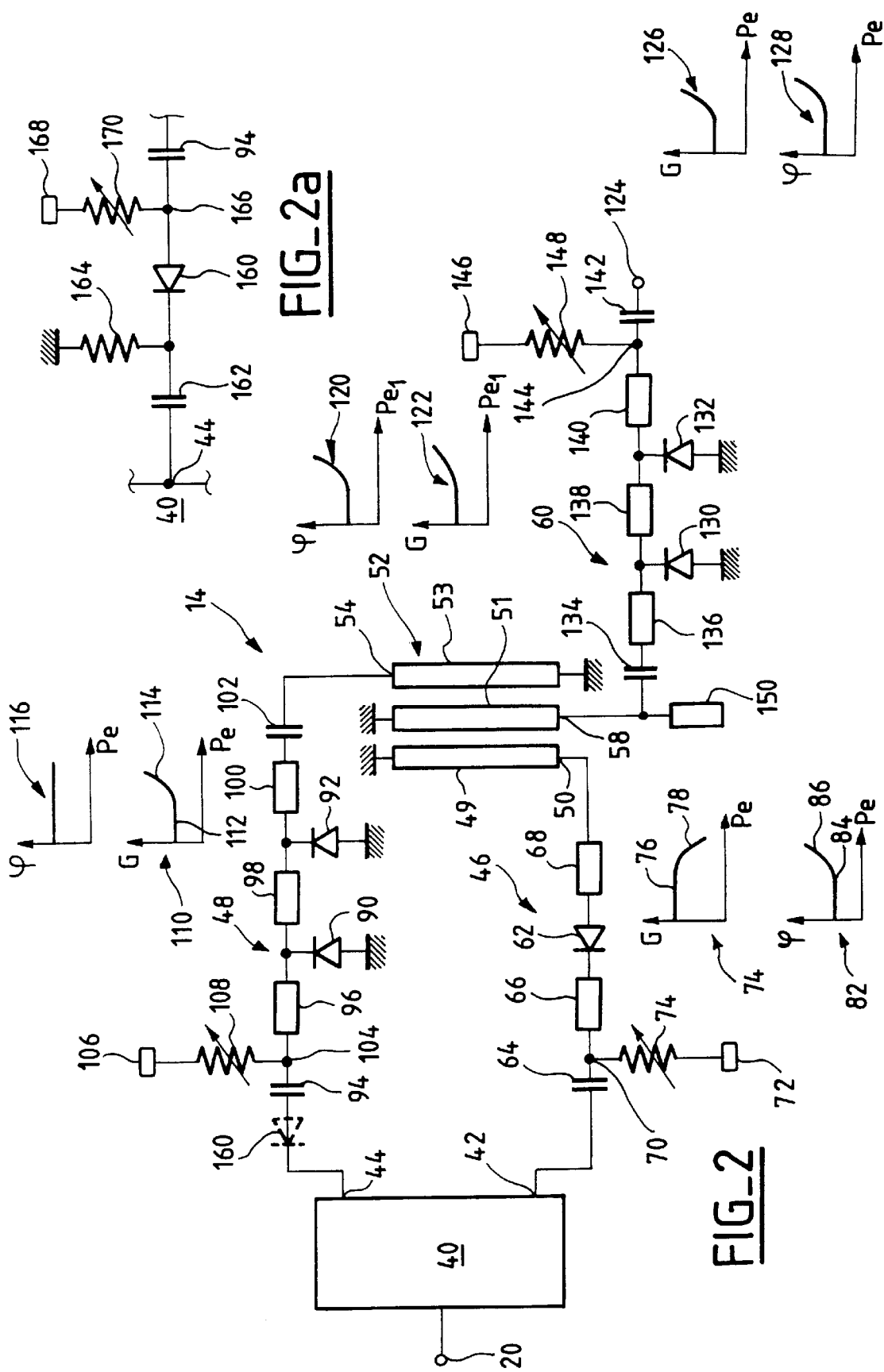

BROAD FREQUENCY BAND LINEARIZATION DEVICE

FIELD OF THE INVENTION

The invention relates to a linearization device for an amplifier with a broad frequency band, notably in the UHF range.

BACKGROUND OF THE INVENTION

When the power requirement of electronic signals are high, recourse is had to an amplifier which is made to operate close to its saturation power. By way of example, the transmission requirements of telecommunications satellites, for which amplifiers with a progressive-wave tube or tubes are often used, can be cited here.

Operating close to saturation causes a non-linear response of the amplifier. More precisely, when the input power is substantially lower than the saturation power, the output power is substantially proportional to the input power. On the other hand, when the input power is close to the saturation power, the gain decreases, and takes the value 1 at saturation. This lack of linearity also has an effect on the phase of the output signal: this phase is constant when the amplifier is operating outside the saturation region and, for certain amplifiers (notably those with a progressive-wave tube), decreases when the power is close to the saturation value.

To remedy this drawback, use is normally made, notably for tube amplifiers for which the gain and phase decrease when the input power approaches the saturation value, linearization devices with predistortion. Such a device is disposed upstream from the amplifier or tube to be linearized. It supplies an output signal whose amplitude and phase vary according to the input power in a non-linear manner so that the amplitude and phase of the output signal of the amplifier vary non-linearly as a function of the power of the signal at the input of the predistortion device.

More precisely, in the linearization device, there is applied, both to the gain and to the phase, a predistortion which keeps the gain and phase constant for values of the input power which are substantially less than the saturation power and a gain and phase which increase when the input power approaches the saturation power, which makes it possible to compensate for the reduction in gain and phase of the amplifier.

The predistortion devices known up to the present time which can be used for space applications operate correctly only for frequency bands with relatively low values, for example from 250 to 500 MHz, in a frequency range of between 10.7 and 12.75 GHz.

Linearization devices for amplifying tubes are also known which can operate over a wide frequency band, notably a band from 1.5 to 2 GHz in Ku band. However, the known devices have complex structures using several UHF integrated circuits. They are tricky to adjust and are sensitive to temperature. In addition, they generally have a high price and are bulky, which constitutes a serious drawback for many applications, notably space applications.

OBJECTS AND SUMMARY OF THE INVENTION

The device according to the invention allows linearization over a wide frequency range. It can be produced at low cost and by means of a UHF integrated circuit technology.

The linearization device according to the invention, which operates in the UHF range, comprises an input coupler separating this input signal into two in-phase signals, one of which is delivered to a first channel with a Schottky diode connected in series and the other to a second channel with at least one Schottky diode connected in parallel, the output signals of the two channels being rephased by an output coupler, preferably a 180° coupler.

The channel with a Schottky diode in series confers phase predistortion. On the other hand, it reinforces the distortion of the gain. The channel with a Schottky diode or diodes in parallel keeps the phase constant, but increases the gain. The latter compensates for the parasitic distortion of gain introduced into the channel with a diode in series and provides, at least partially, the necessary predistortion on the gain.

It is preferable for the channel with a diode connected in parallel to have at least two Schottky diodes connected in parallel.

In the preferred embodiment, the output of the coupler, notably at 180°, is connected to the output of the predistortion device by a third channel with at least one Schottky diode connected in parallel.

This third channel supplements the predistortion of the gain obtained by the second channel, also with Schottky diode or diodes connected in parallel. It was found that the best results were obtained by providing two diodes connected in parallel in this third channel.

It is preferable to apply continuous biasing voltages which can be adjusted on the diodes in each channel, so as to permit, in the channel with a diode connected in series, an adjustment of the phase predistortion and, in the channel or channels with diode or diodes connected in parallel, an adjustment of gain predistortion.

When an output coupler is provided for rephasing the signals supplied by the first and second channels, it is advantageous to associate it with an adjustment element, such as a "stub", which maintains the rephasing of the signals of the first two channels in spite of variations in frequency and power.

In the second channel having at least one Schottky diode connected in parallel, it is also possible to provide another Schottky diode connected in series, upstream from the diode (or diodes) connected in parallel, this diode in series being able to improve the gain predistortion.

Thus the invention provides an amplifier linearization device of the predistortion type which comprises two channels each receiving the input signal, the first conferring a phase predistortion and the second conferring a gain predistortion, the two channels supplying a coupler for phasing the output signals on these two channels.

In the preferred embodiment, the rephasing coupler is connected to the input of the amplifier to be linearized by means of a supplementary channel permitting a complementary adjustment of the gain and/or phase predistortion.

The present invention provides a device for linearizing the gain and phase of an amplifier operating in the UHF range comprising means for conferring a predistortion of the gain and phase which compensates for the non-linearities in gain and phase of the corresponding amplifier, notably of the type with electronic tube or tubes, and which has a first channel receiving the input signal and has a Schottky diode connected in series, a second channel which also receives the input signal and has at least one Schottky diode connected in parallel, and a coupler for phasing the signals supplied by the first and second channels.

According to one embodiment, the second channel has two Schottky diodes connected in parallel.

According to one embodiment, the device has a third channel, connected at the output of the coupler and comprising at least one Schottky diode connected in parallel.

The third channel can also have two Schottky diodes connected in parallel.

According to one embodiment, each of the channels has an input for continuous biasing for adjusting the gain and phase predistortions.

This continuous biasing is for example applied by means of an adjustable adjustment resistor.

According to one embodiment, the coupler intended to rephase the signals delivered by the first and second channels is of the 180° type, for example with three transmission lines.

According to one embodiment, the device has an input coupler with two outputs in phase to which there are connected respectively the first and second channels.

This input coupler is for example of the Wilkinson type.

According to one embodiment, the device has a member for keeping the phase of the output coupler constant in spite of the variations in input power and frequency.

According to one embodiment, the Schottky diode is connected in series in the second channel upstream from the diode or diodes connected in parallel.

According to one embodiment, all the diodes are identical.

The invention also provides for an application of the device to the linearization of an electronic-tube amplifier intended to be mounted aboard a space vehicle, notably a telecommunications satellite.

BRIEF DESCRIPTION OF THE DRAWINGS

Other characteristics and advantages of the invention will emerge with the description of some of these embodiments, this being given with reference to the accompanying drawings, in which:

FIG. 1 is a diagram of an amplifier and of a predistortion device,

FIGS. 1a to 1c are diagrams showing the functioning of the linearization device associated with the amplifier, and FIG. 2 is a diagram of one embodiment of a linearization device according to the invention with diagrams showing certain aspects of its functioning, and FIG. 2a shows a part of the device of FIG. 2, for a variant.

MORE DETAILED DESCRIPTION

FIG. 1 depicts a tube-type power amplifier 10 intended, for example, to be installed a board a space vehicle such as a satellite so as to supply one or more transmission antennae (not shown) of a telecommunications system. The signal to be amplified is applied to the input 12 of this amplifier 10 by means of a linearization device 14 of the predistortion type.

The diagram in FIG. 1a shows on the X-axis the input power $P_e$ and on the Y-axis the output power $P_s$. The curve 16 in this diagram relates to the linearization device 14. It can be seen that the curve 16 has, for low input powers, a linear part $16_1$ and, for the highest values of the input power, a non-linear part $16_2$ whose slope is higher than that of the linear part $16_1$.

The diagram in FIG. 1b relates to the functioning of the progressive-wave tube amplifier 10. This diagram is similar to that of FIG. 1a. The curve 18 has a first linear part $18_1$ and a second non-linear part $18_2$ for the highest values of the output power $P_s$, when the latter approaches the saturation power $P_M$. In the part $18_2$, the slope is lower than the slope of the linear part $18_1$ and approaches zero.

The diagram in FIG. 1c shows the relationship between the signal $P_e$ at the input 20 of the device 14 and the signal $P'_s$ at the output 22 of the amplifier 10. It can be seen that the curve of variation of $P'_s$ as a function of $P_e$ has, up to saturation $P_M$, a linear variation 24.

The diagrams in FIGS. 1a to 1c also depict, in broken lines, the variations in the phase $\psi$ of the output signals as a function of the powers $P_e$ or $P'_e$ of the input signals. It can be seen in FIG. 1a that the phase $\psi_1$ of the signal at the output of the device 14 remains constant (the flat part 28) for the lowest values of the input power $P_e$ and increases non-linearly (the part 30) for the input powers which approach the saturation power.

It can be seen in FIG. 1b that the phase $\psi_2$ of the signal at the output 22 of the amplifier 10 is constant for the lowest values of the power $P_e$ at the input 12 and decreases non-linearly (part 34) when this input power approaches the saturation power.

In FIG. 1c, it can be seen that the phase of the signal at the output 22 remains constant (straight line 36).

The embodiment of the invention depicted in FIG. 2 is a linear device for a tube or amplifier intended to be mounted aboard a signal retransmission satellite. This linearization device is intended to be associated with an amplifier operating at between 11 and 12.5 GHz, that is to say with a passband of 1.5 GHz. This passband can attain 2 GHz in band C or in band Ka.

This linearization device is of the predistortion type, like the device 14 depicted in FIG. 1.

The signal at the input 20 is associated with a coupler 40 of the Wilkinson type having two outputs 42 and 44 on which the signals are identical in amplitude and phase. It is know that a couple makes if possible to isolate the outputs 44 and 42 with respect to each other.

The output 42 supplies a first channel 46 intended to effect the phase predistortion and the output 44 is connected to a channel 48 intended to effect a gain predistortion.

The output of the channel 46 is connected to the first input 50 of a coupler 52 of the three-line 180° type whose second input 54 receives the output signal of the second channel 48. The role of the coupler 52 is to rephase the signals of the channels 46 and 48 which are in phase opposition. The output 58 of the coupler 52 is connected to a third channel 64 completing the gain predistortion effected by the second channel 48.

The first channel 46 has a Schottky diode 62 connected in series. In this channel, the output 42 of the coupler 40 is connected to the cathode of the diode 62 by means of a capacitor 64 and a transmission line 66 in series. The anode of the diode 62 is connected to the input 50 of the coupler 52 by means of another transmission line 68. The input 50 is connected to earth by means of a line 49 of the coupler 52.

The point 70 common to the capacitor 64 and resistor 66 is connected to a terminal 72 by means of an adjustable resistor 74. To the terminal 72 there is applied a continuous adjustable biasing voltage which makes it possible to adjust the biasing of the diode 62 and therefore to adjust the phase predistortion characteristic conferred by this channel 46.

In a conventional fashion, the purpose of the capacitor 64 is to eliminate the continuous component of the signal applied at the input 42.

The diagram 74 shows the variation in the gain G of this channel 46 as a function of the input power, that is to say of the power of the signal at the output 42 of the coupler 40. The gain is the ratio between the power of the signal at the input 50 of the coupler 52 and the power of the signal at the output 42 of the coupler 40. This gain has a constant value, as shown by the part 76 of the diagram 74, and decreases when the input power approaches saturation, as shown by the part 78 of the diagram 74. This property of the channel or arm 46 is not favourable to predistortion. As will be seen later, this characteristic of the channel 46 is corrected by the channels 48 and 60.

On the other hand, as shown by the diagram 82, the channel 46 effects the required predistortion on the phase. In fact, this diagram 82 shows, on the X-axis, the power $P_e$ at the output 42 of the coupler 40 and on the Y-axis the phase $\psi$ of the signal applied at the input 50 of the coupler 52. This phase $\psi$ is constant for the lowest values of $P_e$, as shown by the part 84 of the diagram 82, and increases when $P_e$ approaches the saturation power, as shown by the part 86 of the same diagram 82.

In the second channel 48, two Schottky diodes 90 and 92 are provided, connected in parallel, their anodes being connected to earth. The cathode of the diode 90 is connected to the output 44 of the coupler 40 by means of a capacitor 94 and a transmission line 96 in series. The cathode of the diode 90, and therefore also the transmission line 96, is connected to the cathode of the diode 92 by means of another transmission line 98. The cathode of the diode 92 is connected to the input 54 of the coupler 52 by means of a transmission line 100 and a capacitor 102 in series.

The point 104 common to the capacitor 94 and the line 96 is connected to a terminal 106 by means of an adjustable resistor 108. To the terminal 106 there is applied a continuous biasing voltage for adjusting the biasing of the diodes 90 and 92 making it possible to adjust the gain predistortion effected by this channel 48.

As shown by the diagram 110, this channel 48 partially effects the required predistortion of the gain, that is to say, for the low values of the input power, that is to say of the power at the terminal 44, the gain is constant (part 112 of the diagram 110) and, for the higher values of the input power, the gain increases (part 114 of the diagram 110). The channel 48 has no effect on the phase, as shown by the diagram 116, that is to say the phase at the input 54 of the coupler 52 remains constant when the power at the terminal 44 varies.

At the output 58 of the coupler 52 there is obtained, for the phase, the signal represented by the diagram 120, which is identical to the diagram 82. In this diagram 120, the power $P_{e1}$ of the signal applied to the input 20 of the coupler 40 has been entered on the X-axis and the phase of the signal at the output 58 on the Y-axis.

The diagram 122 depicts the gain of the signal at the output 58 as a function of the power $P_{e1}$. The gain predistortion thus obtained is insufficient to linearise the amplifier with which the device depicted in FIG. 2 must be associated, since the purpose of the channel 48 is particularly to correct the parasitic distortion conferred by the gain by the channel 46 (diagram 74).

The coupler 52 comprises a first transmission line 49 between the input 50 and earth, a second transmission line 51 between the output 58 and earth, and a third transmission line 53 between the input 54 and earth. The three lines 49, 51 and 53 are parallel and the line 51 is disposed between the lines 49 and 53.

The channel 60 maintains the phase correction created by the channel 46 with a diode 62 in series, whilst it reinforces the gain predistortion created by the channel 48 with diodes in parallel. Thus, at the output 124, the required gain and phase predistortions are obtains (diagrams 126 and 128).

The channel 60 is similar to the channel 48, that is to say it has two Schottky diodes 130 and 132 connected in parallel. Thus the anodes of the diodes 130 and 132 are connected to earth. The cathode of the diode 130 is connected to the output 58 of the coupler 52 by means of a capacitor 134 and a resistor or transmission line 136 in series. The cathode of the diode 130 is also connected to the cathode of the diode 132 by means of another transmission line 138. The cathode of the diode 132 is connected to the output 124 by means of a transmission line 140 and a capacitor 142 in series. The terminal 144 common to the line 140 and capacitor 142 is connected to a terminal 146 by means of an adjustable resistor 148. A voltage or continuous adjustment biasing intended to adjust the gain curve 126 is applied to the terminal 146.

Finally, the phase of the coupler 52 is automatically adjusted by means of a stub 150 connected to the output 58.

The linearization device or lineariser which has just been described in relation to FIG. 2 functions over a wide UHF band. In one example, it permits the linearization of an amplifier from 11 to 12.5 GHz.

In a variant, in the channel 48, a Schottky diode 160 is provided (shown in broken lines in the figure) connected in series, whose cathode is directly connected to the output 44 of the coupler 40 and whose anode is connected to the capacitor 94. This diode improves the predistortion characteristic of the channel 48 by pushing the part 114 back towards the higher powers $P_e$ and increasing the exponential (rounded) character of this part 114.

In a variant depicted in FIG. 2a, the Schottky diode 160 connected in series is associated with a biasing circuit having a capacitor 162 disposed between the output 44 of the coupler 40 and the cathode of the diode 160. The point common to the capacitor 162 and to the cathode of the diode is connected to earth by means of a resistor 164. Finally, the anode of the diode 160 is connected to the capacitor 94 and the point 166 common to the anode of the diode and to the capacitor 94 is connected to a terminal 168 by means of an adjustment resistor 170. The terminal 168 is intended to receive a continuous adjustment biasing. Thus this adjustable biasing and the adjustable value of the resistor 70 confer additional adjustment possibilities.

For an optimum functioning and in order to facilitate manufacture, it is preferable for all the diodes of the device 14 to be identical.

It should be noted that the resistors 74, 108, 148 and 170 are of the ohmic type and therefore easy to adjust. Their values are high in order to block the UHF signals. This value is of several kilohms. These resistors have an effect only in direct current. These are normal components easy to implement. These resistors confer a different auto-biasing on the associated diodes.

The device 14 depicted in FIG. 2 can be produced in an easy fashion. In order to obtain the correct gains and phases, the lengths and widths of the transmission lines 66, 68, 96, 98, 100, 136, 138 and 140 are calculated by conventional methods. It may also be noted that the characteristics of the member 150 can easily be calculated so that the coupler 52, associated with this member 150, confers, whatever the input power and the frequency, the necessary phase shifting to rephase the signals of the channels 46 and 48.

It is in principle possible to dispense with the channel 60. However, the latter facilitates adjustments during design and/or use.

In addition, producing the device 14 is particularly simple since, apart from the diodes, all the elements can be produced in the form of etched circuits. Moreover, the adjustments are made by means of DC voltages and direct current biasing resistors, which is much more simple than a UHF adjustment.

It has excellent temperature stability. The cost and weight of the device can be particularly low. Finally, it can be produced in the form of an integrated circuit in so-called "MMIC" technology for UHF circuits.

What is claimed is:

1. A device for linearizing the gain and phase of an amplifier operating in the UHF range, the device receiving an input signal, the device comprising:
    a coupler having first and second inputs, and an output;
    a first channel receiving the input signal and supplying a first output signal, the first channel comprising a Schottky diode coupled in series to the first input of the coupler;
    a second channel receiving the input signal and supplying a second output signal, the second channel coupled to the second input of the coupler, and the second channel comprising at least one Schottky diode coupled between the second input of the coupler and ground,
    the coupler putting in phase the first and second output signals supplied by the first and second channels, respectively; and
    a third channel, connected at the output of the coupler and comprising at least one Schottky diode.

2. A device according to claim 1, characterised in that the second channel comprises two Schottky diodes coupled in parallel between the second input of the coupler and ground.

3. A device according to claim 1, characterised in that the third channel comprises two Schottky diodes coupled in parallel between the input of the third channel and ground.

4. A device according to claim 1, characterised in that each of the channels has an input for continuous biasing for adjusting the gain and phase predistortions.

5. A device according to claim 4, characterised in that the continuous biasing is applied by an adjustable adjustment resistor.

6. A device according to claim 1, characterised in that the coupler for rephasing the signals delivered by the first and second channels is of the 180° type.

7. A device according to claim 1, characterised in that it has an input coupler with two outputs in phase, to which there are respectively connected the first and second channels.

8. A device according to claim 7, characterised in that the input coupler is of the Wilkinson type.

9. A device according claim 1, characterised in that it has a member for keeping the phase of the output coupler constant in spite of the variations in the input power and frequency.

10. A device according to claim 7, characterised in that a Schottky diode is coupled in series between the output of the input coupler and the second channel.

11. A device according to claim 1, characterised in that all the diodes are identical.

12. An electronic-tube amplifier intended to be mounted aboard a space vehicle that incorporates a device according to claim 1.

13. A telecommunications satellite comprising an electronic tube amplifier that incorporates a device according to claim 3.

14. A device according claim 1, characterised in that the Schottky diode comprising the first channel is coupled to the first input of the coupler via a transmission line.

15. A device according to claim 1, characterised in that the least one Schottky diode comprising the second channel is coupled to the second input of the coupler via a series-coupled transmission line and a capacitor.

16. A device for linearizing the gain and phase of an amplifier operating in the UHF range, the device receiving an input signal, the device comprising:
    a coupler having first and second inputs, and an output;
    a phase correction channel that receives the input signal and outputs a phase corrected signal, the phase correction channel comprising a Schottky diode coupled in series to the first input of the coupler;
    a gain predistortion channel that receives the input signal and outputs a gain predistorted signal, the gain predistortion channel coupled to the second input of the coupler, and the gain predistortion channel comprising at least one Schottky diode coupled between the second input of the coupler and ground,
    the coupler putting in phase the phase correction signal and the gain predistortion signal; and
    an additional channel having an input, and the input is coupled to the output of the coupler, and the additional channel comprises at least one Schottky diode coupled between the input and ground.

17. The device according to claim 16, characterised in that each of the channels has an input for continuous biasing for adjusting the gain predistorted signal and the phase corrected signal.

18. The device according to claim 17, characterised in that the continuous biasing is applied by an adjustable resistor.

19. The device according to claim 16, characterised in that the coupler for rephasing the signals delivered by the phase correction and gain predistortion channels is of the 180° type.

20. The device according to claim 16, characterised in that it has an input coupler with two outputs in phase, to which there are respectively coupled the phase correction and gain predistortion channels.

21. The device according to claim 20, characterised in that the input coupler is of the Wilkinson type.

22. The device according claim 16, characterised in that it has a member for keeping the phase of the output coupler constant in spite of the variations in the input power and frequency.

23. The device according to claim 16, characterised in that a Schottky diode is coupled in series between the output of the input coupler and the gain predistortion channel.

24. A device according claim 16, characterised in that the Schottky diode comprising the phase correction channel is coupled to the first input of the coupler via a transmission line.

25. A device according claim 16, characterised in that the least one Schottky diode of the gain predistortion channel is coupled to the second input of the coupler via a transmission line and a capacitor.

* * * * *